United States Patent [19]

Yamaguchi

[11] 4,234,853
[45] Nov. 18, 1980

[54] AUTOMATIC LEVEL CONTROL CIRCUIT

[75] Inventor: Hiroyasu Yamaguchi, Yokohama, Japan

[73] Assignee: Tokyo Shibaura Denki Kabushiki Kaisha, Kawasaki, Japan

[21] Appl. No.: 923,629

[22] Filed: Jul. 11, 1978

[30] Foreign Application Priority Data

Jul. 15, 1977 [JP] Japan ............................ 52/94354

[51] Int. Cl.² ............................................ H03G 3/30
[52] U.S. Cl. .................................... 330/280; 330/279; 330/282; 330/284
[58] Field of Search ............... 330/279, 280, 282, 284

[56] References Cited

U.S. PATENT DOCUMENTS

| | | | |
|---|---|---|---|
| 3,353,103 | 11/1967 | Berry et al. | 330/284 X |
| 3,560,995 | 2/1971 | Zielinski et al. | 330/284 X |
| 3,564,438 | 2/1971 | Limberg | 330/261 |
| 3,579,112 | 5/1971 | Harford | 330/284 X |
| 3,649,847 | 3/1972 | Limberg | 330/284 X |
| 3,803,505 | 4/1974 | Ishigaki et al. | 330/284 X |
| 3,927,381 | 12/1975 | Sato et al. | 330/284 X |
| 4,053,846 | 10/1977 | Acker | 330/279 |

FOREIGN PATENT DOCUMENTS

| | | |
|---|---|---|
| 45-19858 | 8/1970 | Japan . |
| 46-41321 | 12/1971 | Japan ................................ 330/284 |
| 50-13478 | 4/1975 | Japan . |

*Primary Examiner*—James B. Mullins
*Attorney, Agent, or Firm*—Cushman, Darby & Cushman

[57] ABSTRACT

An automatic level control circuit including a current controlled attenuator wherein the amount of attenuation is controlled by a control current, an amplifier for amplifying an output signal of the attenuator, a current rectifier for forming a DC current source in accordance with the amplitude of the output signal voltage from the amplifier, and a current shunt for absorbing an output current fed from the rectifier. The control current is produced as a difference between the current from the rectifier and the current absorbed by the shunt. When the current fed from the rectifier is larger than that absorbed by the shunt, the automatic level control circuit operates in a manner that, when its input signal is at low level, the circuit gain is large and, as the input signal level rises, the circuit gain drops.

25 Claims, 25 Drawing Figures

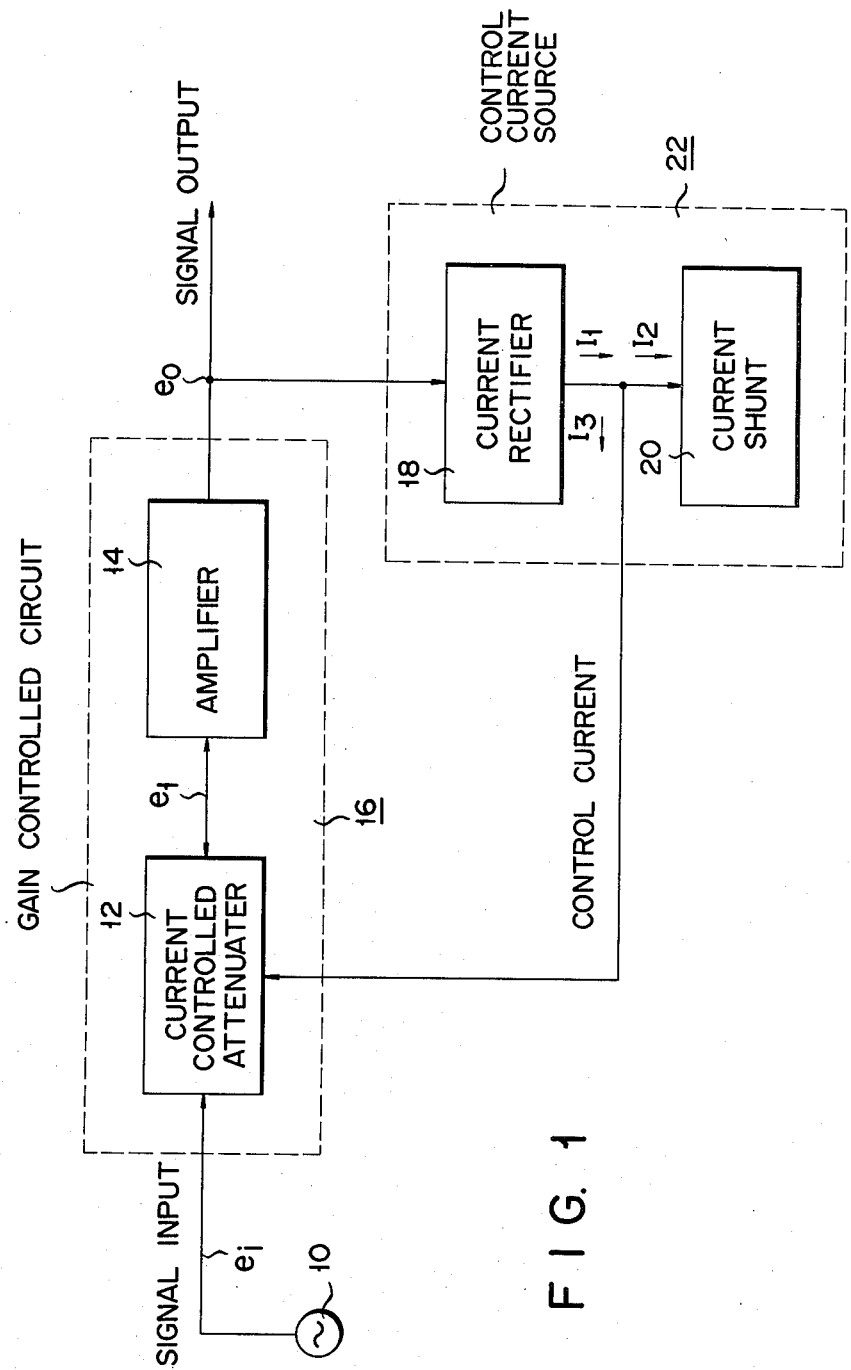
F I G. 1

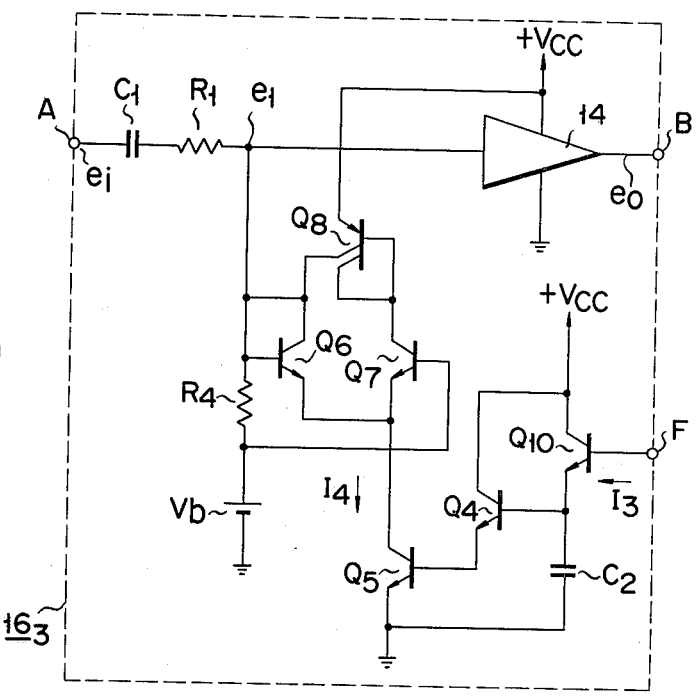
F I G. 11
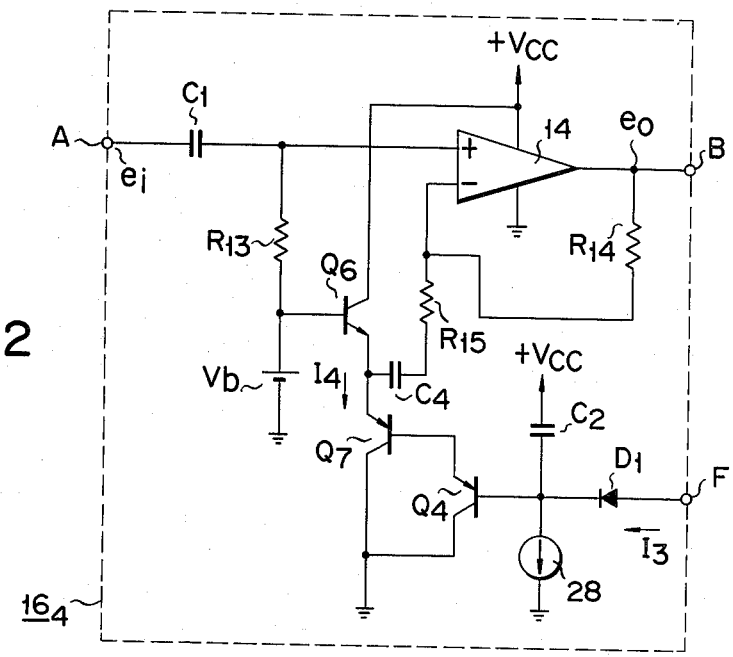
F I G. 12

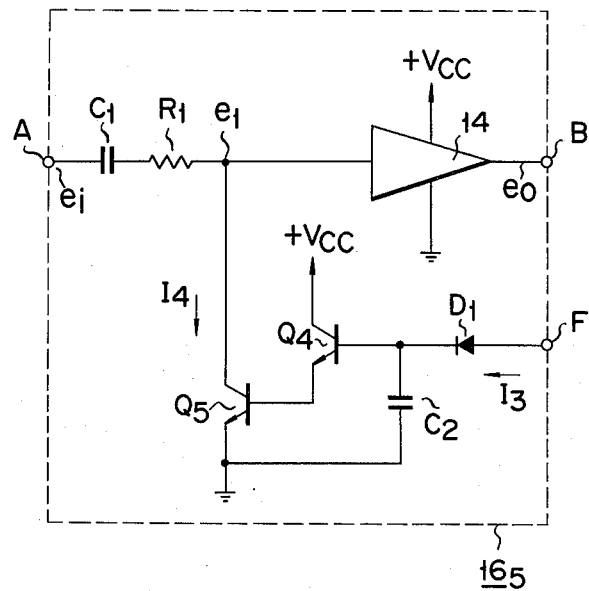
F I G. 13
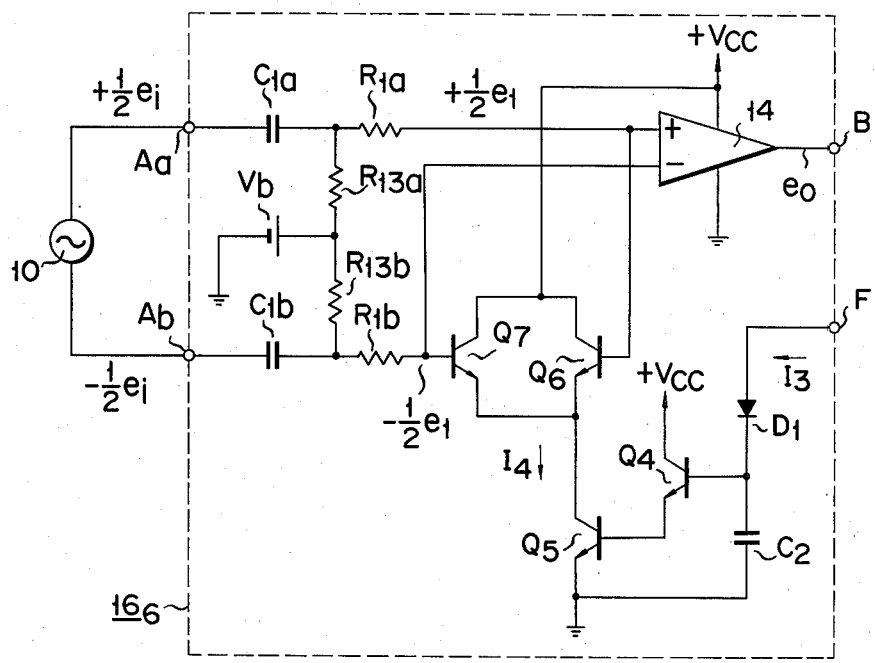
F I G. 14

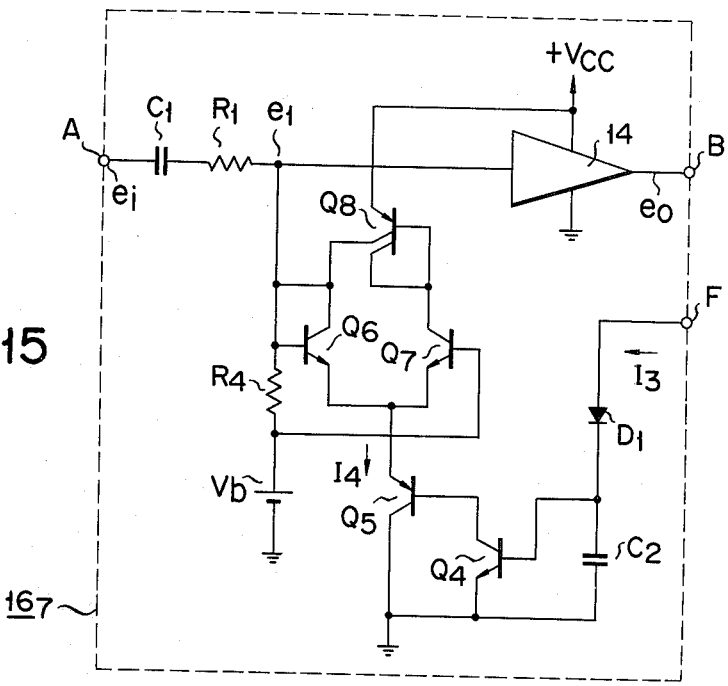
F I G. 15
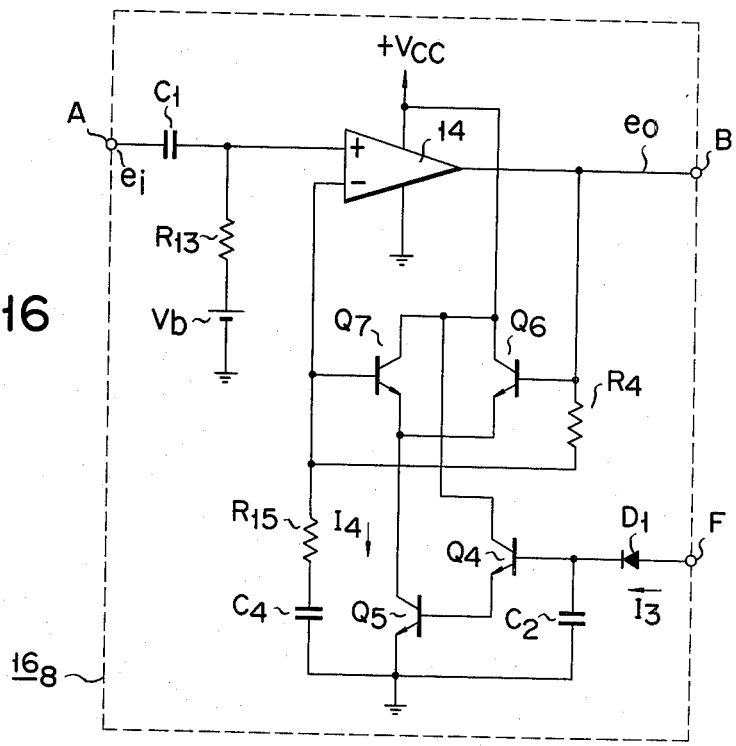
F I G. 16

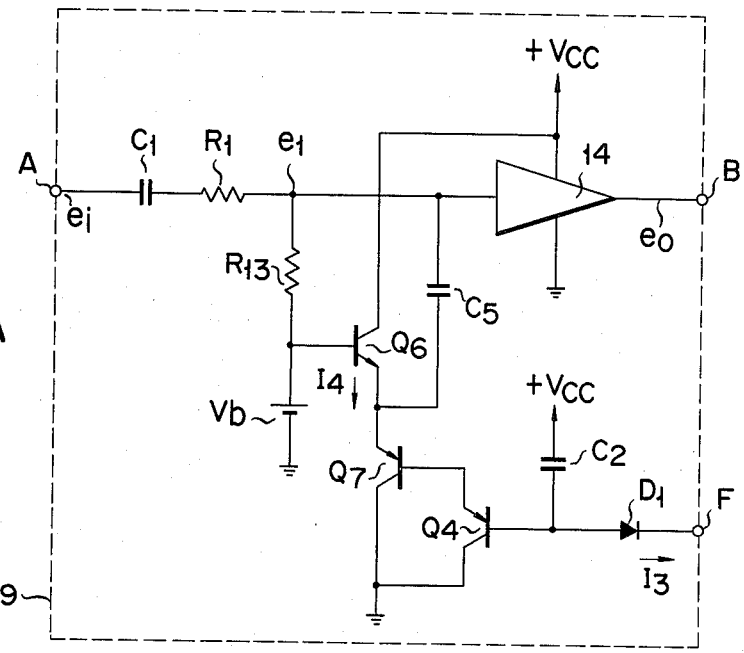
F I G. 17A
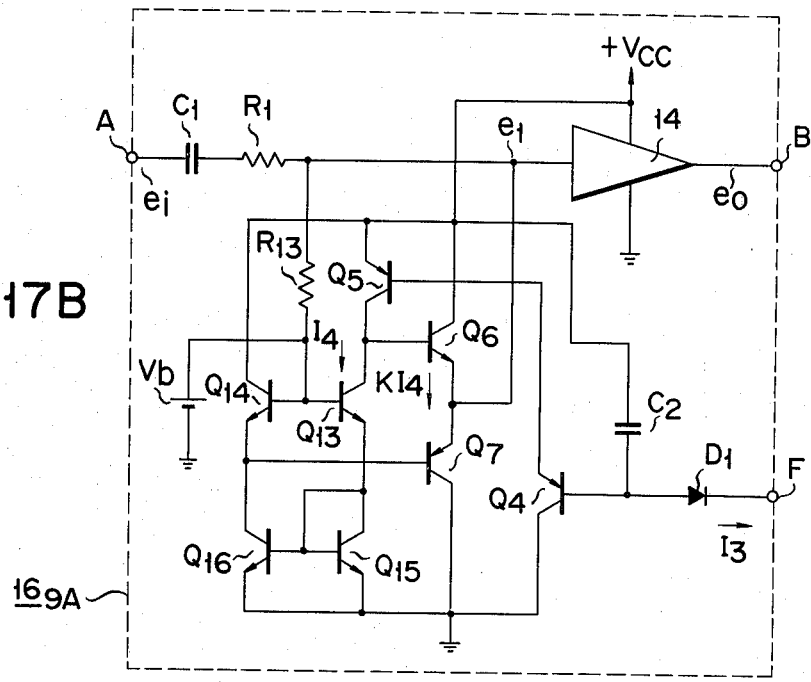
F I G. 17B

AUTOMATIC LEVEL CONTROL CIRCUIT

The invention relates to an automatic level control circuit used in a recording circuit of a tape recorder, for example.

When it is desired to prevent occurrence of the clipping distortion due to a sudden and excessive high level incoming signal as observed in the recording circuit of a tape recorder, it is a common practice to use an automatic level control (ALC) circuit in such a circuit. A tape recorder with an ALC circuit is so designed that the gain of the recording circuit becomes large for a low level input signal while it becomes small for a high level one. Use of the ALC circuit allows saturation of a magnetic tape due to an unexpected, excessive level input signal to be automatically avoided. An additional advantage resulting from the use of the ALC circuit is that since no care must be taken with regard to the saturation of the magnetic tape, signal to noise ration (S/N ratio) is improved. The conventional ALC circuit of a type wherein a signal level is detected by a diode rectifier circuit which in turn perform a signal attenuation control suffers from the following disadvantages:

(1) The voltage-current characteristic between base and emitter of the amplitude control transistor for signal attenuation control and the voltage-current characteristic of the rectifier diode in the forward direction, depends largely on temperature. For this, the operative characteristic of the ALC circuit greatly changes with temperature.

(2) The operation point of the ALC is set depending on the base-emitter voltage (threshold voltage) of the amplitude control transistor. Therefore, detection of a low input signal of which voltage level is lower than the threshold voltage, is almost impossible. The threshold voltage of the amplitude control transistor and the forward voltage drop across of the rectifier diode for applying a control DC voltage to the amplitude control transistor, change the operating point of the ALC circuit. This implies that variation of the base-emitter voltage of the amplitude control transistor or the forward voltage drop across the rectifier diode changes the output signal level of the ALC circuit.

Accordingly, an object of the invention is to provide an automatic level control circuit having an operative characteristic that is free from temperature change and variation of the base-emitter voltage of an amplitude control transistor and wherein the operating point may smoothly be set over a wide range of level.

To achieve the object of the invention, there is provided an automatic level control circuit comprising: a gain controlled circuit which, upon receipt of an input signal to automatically be level-controlled, produces an output signal automatically level-controlled, and includes a variable impedance element having an internal impedance that is controlled by a control current so that the gain of the gain controlled circuit is varied in accordance with the level of the input signal; and a control current source for providing the control current which includes a DC component having a level corresponding to the output signal level of the gain control circuit and having a magnitude that is independent of temperature change.

The automatic level control circuit thus constructed employs a temperature-compensated control current as its gain control so that the control characteristic of the automatic level control circuit is not affected by temperature. Additionally, by using current for the gain control, the control characteristic may be free from the voltage characteristic at a control signal (control current) input terminal of the variable impedance element. Therefore, setting of the operation point may be made over a wide range of level. Further, it renders the circuit suitable for IC fabrication.

Other objects and feature of the invention will be apparent from the following description taken in connection with the accompanying drawings, in which:

FIG. 1 shows a block diagram of a basic construction of an automatic level control circuit according to the invention;

FIGS. 11 to 16 show the circuit diagrams of modifications of the gain controlled circuit used in the FIG. 2 circuit;

Figure 2:
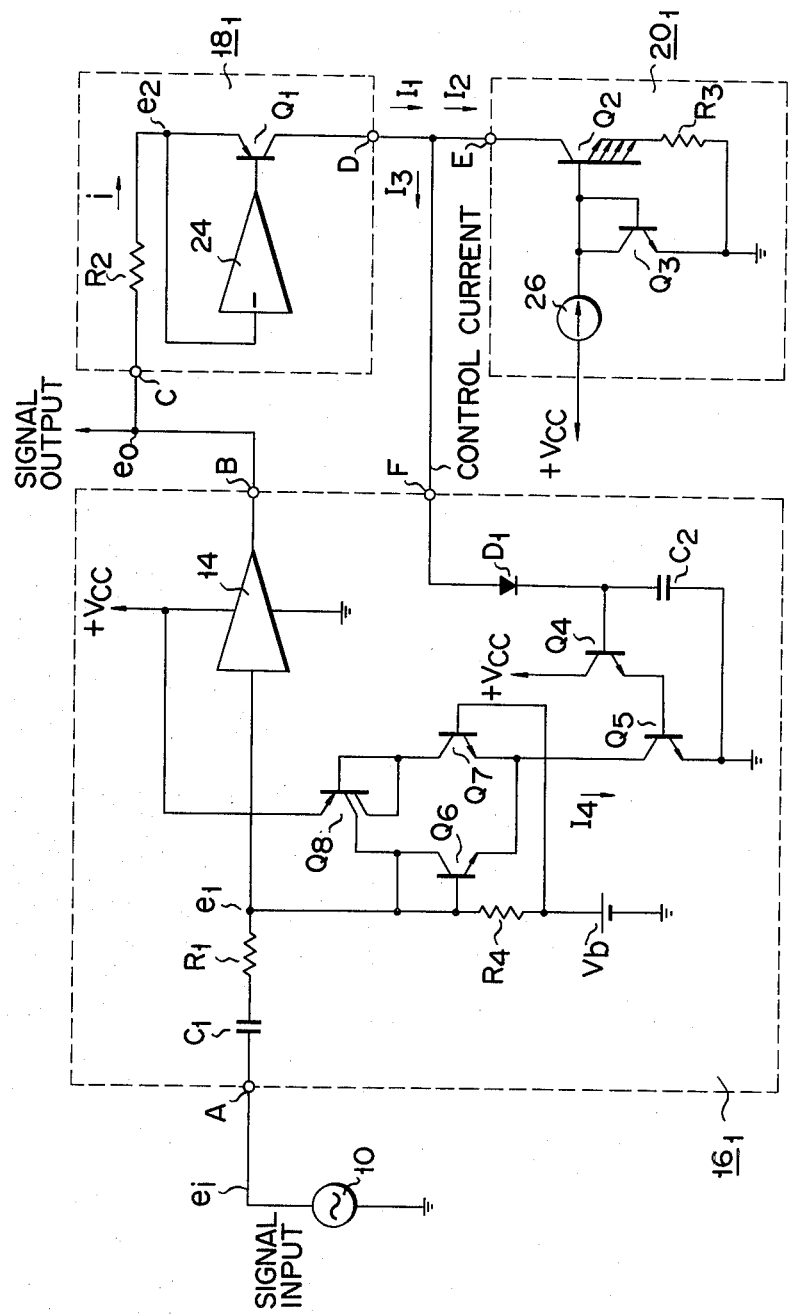
FIG. 2 shows a circuit diagram of the circuit shown in FIG. 1.
Figure 6:
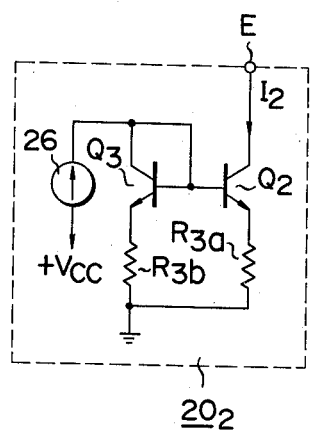
FIGS. 6 to 8 show the circuit diagrams of modifications of the current shunt shown in FIG. 2.
Figure 10:
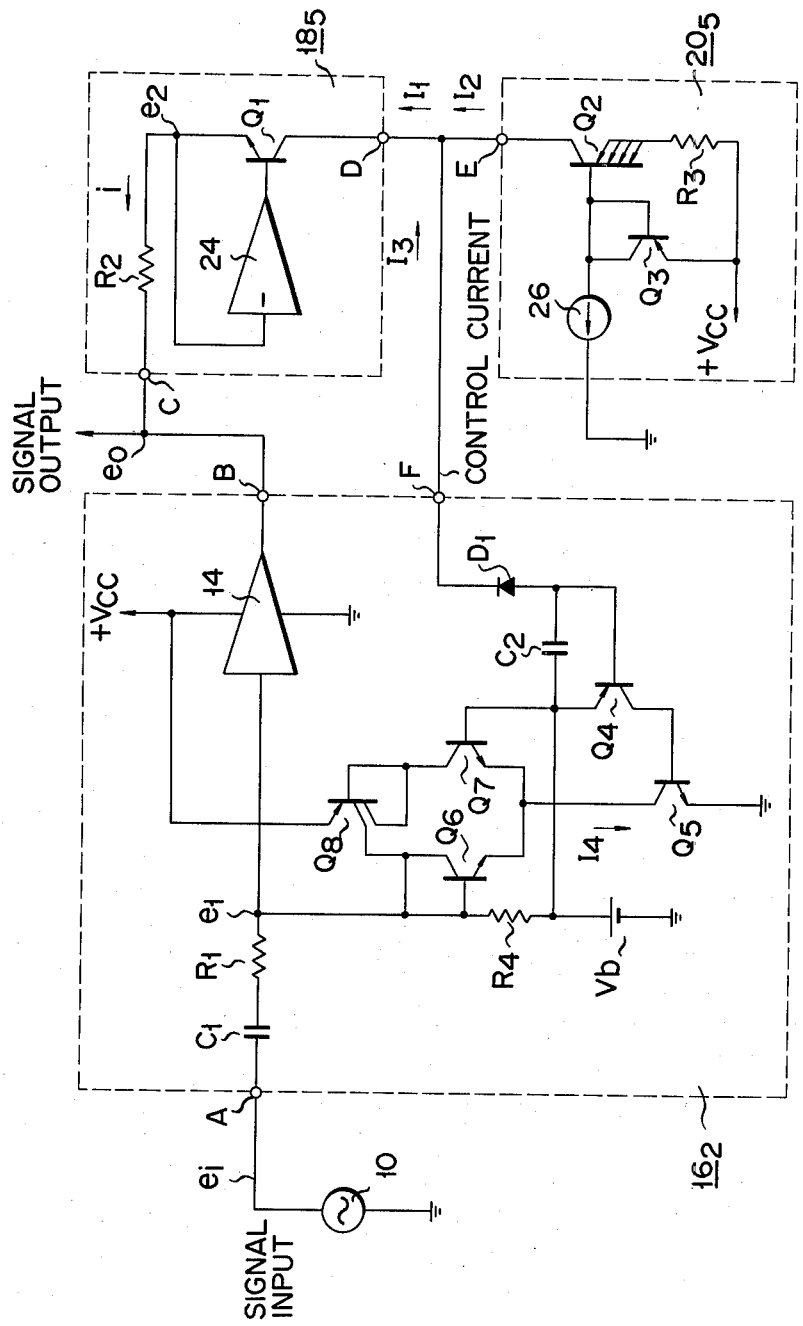
FIG. 10 shows another circuit diagram of the circuit shown in FIG. 1.

FIGS. 17A and 17B to 20 show the circuit diagrams of modifications of the gain controlled circuit used in the circuit construction in FIG. 10; and FIGS. 21 to 24 show the circuit diagrams of the constant current sources 26 shown in FIGS. 2, 6 and 10 or the bias current sources 28 shown in FIGS. 12, 18 to 20.

To illustrate some preferred embodiments of the invention, reference will be made to FIGS. 1 to 24. On the drawings corresponding parts of different embodiments have been given the same or equivalent numerals.

FIG. 1 illustrates in block form a basic construction of an automatic level control circuit (abbreviated as an ALC circuit) according to the invention. As shown, an input signal $e_i$ such a voice signal is fed from an input signal source 10 to a current controlled attenuator 12. The attenuation ratio of the attenuator 12 is controlled by a control current $I_3$. A signal $e_1$ derived from the attenuator 12 is amplified by an amplifier 14 to be an output signal $e_O$. The attenuator 12 and the amplifier 14 cooperate to construct a gain controlled circuit 16. The signal $e_O$ is outputted as an output signal automatically level-controlled to an exterior circuit, for example, a recording circuit of a tape recorder, and also to a current rectifier 18. The rectifier 18 rectifies the signal $e_O$ into a current $I_1$ including a direct current (DC) component with a magnitude corresponding to that of the signal $e_O$. The rectifier 18 is a current source with a high internal impedance. The current $I_1$ is supplied to a current shunt 20. The shunt 20 also has a high internal impedance. A fixed DC current $I_2$ independent from the current $I_1$ is absorbed by the shunt 20 and a difference between the currents $I_1$ and $I_2$ becomes the control curren $I_3$. The rectifier 18 and the shunt 20 constitute a control current source 22.

Turning now to FIG. 2, there is shown a circuit diagram embodying the construction shown in FIG. 1. In the figure, the signal $e_i$ is applied to the input terminal A of the gain controlled circuit $16_1$. The signal $e_i$ applied to the terminal A is inputted to the amplifier 14, through a capacitor $C_1$ for blocking DC current and a resistor $R_1$ for attenuator. The signal $e_O$ derived from the amplifier 14 is applied through the output terminal B to an exterior circuit and also to the input terminal C of the current rectifier 18₁. The signal $e_O$ applied to the terminal C is transferred to the emitter of a PNP transistor Q1, by way of a resistor R2. When the DC operating potential at the B terminal is different from that at the C terminal, a DC blocking capacitor is inserted between the terminal B and C. To the emitter of the transistor Q1, is connected the inverted-phase input terminal of a phase-inverted amplifier 24, and the output terminal of the amplifier 24 is connected to the base of the transistor Q1. The transistor Q1 is connected at the collector to the output terminal D of the rectifier 18₁.

In the rectifier 18₁, the current i flowing through the resistor R2 is given by $i=(e_O-e_2)/R2$ where $e_2$ is a signal at the inverted-phase input terminal of the amplifier 24. Assuming that the current amplification factor hfe of the transistor Q1 is sufficiently large, the current i flows as the current $I_1$ from the terminal D when the signal $e_O$ is higher in potential than the signal $e_2$. Conversely, when the potential of the signal $e_O$ is lower than that of the signal $e_2$, the base-emitter path of the transistor Q1 is inversely biased so that the transistor Q1 is cut off and the current $I_1$ becomes substantially zero. Since the base-emitter path of the transistor Q1 is inserted in the feedback loop of the amplifier 24, variation of the potential difference (threshold voltage) between the base and emitter of the transistor Q1 due to change of ambient temperature is absorbed through the feedback operation. Therefore, when the gain of the amplifier 24 are much larger than 1, the current $I_1$ does not change with temperature. Even through the temperature coefficient of the resistor R2 is not zero, if the temperature characteristic of the current $I_2$ is so formed as to cancel the temperature coefficient of the resistor R2, it is possible to make a temperature compensation of the current $I_1$. Because of supplying the current $I_1$ from the collector of the transistor Q1, the internal impedance of the rectifier 18₁ as seen from the terminal D is extremely high. The rectifier 18₁ is a half-wave rectifier current source to supply the current $I_1$ in accordance with the signal $e_O$.

Although not shown, when an AC potential of the normal phase input terminal of the amplifier 24 is zero potential, the inverted-phase input terminal of the amplifier 24 may be considered as an imaginary ground. Accordingly, during the half-wave period that the transistor Q1 is forwardly biased, the signal $e_2$ is substantially zero and thus the current i is equal to $e_O/R2$.

The current $I_1$ taken from the terminal D is fed to the input terminal E of the shunt 20₁ and the control current input terminal F of the circuit 16₁. In the shunt 20₁, to the terminal E is connected the collector of a multiemitter type NPN transistor Q2 of which the emitters are connected through a resistor R3 to a ground circuit. Between the base of the transistor Q2 and the ground circuit, is connected an NPN transistor Q3 diode-connected. A constant current source 26 for biasing is inserted between the base of the transistor Q2 and a positive power source +Vcc. The transistor Q2 is biased by the forward voltage drop (threshold voltage) across base-emitter path of the transistor Q3, and the magnitude of the current $I_2$ or the collector current of the transistor Q2, may properly be set by means of the resistor R3. The following relation holds between the current $I_2$ and the resistor R3

$$I_2 R3 = \frac{kT}{q} \ln \frac{NI_{26}}{I_2}$$

where k is Boltzmann's constant, T is absolute temperature, q is electron charge, N is area ratio of the emitters of Q2 and Q3 and $I_{26}$ is current of the constant current source 26. Accordingly, if the constant current source 26 has a negative temperature coefficient, it is possible to make an overall temperature compensation of the current $I_2$ which also includes a drift component variable with the temperature coefficient of the resistor R3. Further, since the bias currents of the transistors Q2 and Q3 are obtained from the constant current source 26, it may be so designed that the voltage between the base and emitter of the transistor Q2 is not changed by the voltage variation of the power source +Vcc. That is, the current $I_2$ does not change even if the voltage of the power source +Vcc changes.

The control current $I_3$ fed from the terminal F is equal to the difference subtracting the current $I_2$ from the current $I_1$. As described above, the currents $I_1$ and $I_2$ or the difference $I_1$ to $I_2$ is temperature-compensated so that the current $I_3$ does not change depending on temperature. If the temperature coefficients of the currents $I_1$ and $I_2$ are substantially equal, the temperature coefficient of the current $I_3$ given by $I_1-I_2$ may be made substantially zero. The current $I_3$ thus temperature-compensated is supplied through a diode D1 to one end of a hold capacitor C2 which is grounded at its other end. The diode D1 is used to feed the current $I_3$ to the capacitor C2 only when $I_1>I_2$. In other words, provision of the diode D1 prevents charges stored in the capacitor C2 from being absorbed by the shunt 20₁, when $I_1<I_2$. The provision of the same also allows the current $I_3$ to flow therethrough only when $I_1>I_2$. That is to say, the ALC circuit is so constructed that the ALC operation is not conducted for the input signal $e_i$ with a level falling within a range corresponding to the current $I_1$ when $I_1<I_2$.

Charges stored in the capacitor C2 by the current $I_3$ are supplied to the base of a PNP transistor Q4. The collector of the transistor Q4 is coupled with the power source +Vcc and the emitter thereof is connected to the base of an NPN transistor Q5. The transistor Q5 is connected at the collector to the emitters of NPN transistors Q6 and Q7 as variable impedance elements, and the emitter of the transistor Q5 is grounded. The reason why the transistors Q4 and Q5 are connected in Darlington fashion, is to increase the input resistance of the transistors Q4+Q5 by increasing the current amplification factor hfe of the transistors Q4 and Q5. Therefore, in such a case that a transistor with an extremely high hfe may be procured or that the current $I_3$ with sufficiently large magnitude and the capacitor C2 with large capacity may be produced, the transistors Q4+Q5 may be replaced by a single transistor. When the time constant of the input resistance of the transistor pair Q4 and Q5 and the capacitor C2 is too small, the operation of the ALC circuit is instable.

The base and collector of the transistor Q6 is connected to the input terminal of the amplifier 14. Between the bases of the transistors Q6 and Q7 is inserted a resistor R4. The base of the transistor Q7 is connected to a positive bias source Vb. Connected to the base and collector of the transistor Q6 is the first collector of a multicollector PNP transistor Q8. Connected to the collector of the transistor Q7 are the second collector and the base of the transistor Q8. The emitter of the transistor Q8 is connected to the power source +Vcc. The transistor Q8 may be of laterally type and operates as a current mirror. The collector currents of the transistors Q6 and Q7 become substantially equal so that the impedances (hib) between the bases and emitters of transistors Q6 and Q7 are substantially equal. From this fact, it can be considered that the base-base impedance of each transistor Q6 and Q7 is ½hib.

Assume now that the impedance in the series circuit of the capacitor C1 and the resistor R1 is regarded as R1, the internal impedance of the power source Vb is negligible, the input impedance of the amplifier 14 is much larger than ½hib, R4>>½hib, and the amplification factor of the amplifier 14 is A. The transfer function $G_{ATT1}$ $(=e_O/e_i)$ of the attenuator 12 comprising the impedance R1 and ½hib is expressed as an approximation $$G_{ATT1} \approx \frac{\frac{1}{2} hib}{R1 + \frac{1}{2} hib} \quad (1)$$

In the equation (1), the impedance ½hib changes as the emitter currents of the transistors Q6 and Q7, i.e. the collector current $I_4$ of the transistor Q5, change. In a stationary condition the current $I_4$ is substantially proportional to the current $I_3$ and the current $I_3$, when $I_1 > I_2$, is proportional to the signal $e_O$ voltage as previously stated, and the signal $e_O$ is proportional to the signal $e_1$. The transfer function $G_{ATT1}$ indicating the attenuating ratio of the attenuator 12 becomes small as the signal $e_1$ becomes large.

The magnitude of the current $I_3$ has an upper limit. As described above, $I_3 = I_1 - I_2$ and the current $I_2$ is set at a fixed value. Therefore, the upper limit of the current $I_3$ can be considered to be equal to the upper limit of the current $I_1$. As described above again, the upper limit of the current $I_1$ may be set by the upper limit of the signal $e_O$ level and the resistance of the resistor R2. That is, the upper limit of the signal $e_O$ level, or the signal limiting level, is determined by the upper limit of the current $I_3$. At this time, the h parameter hib of each transistor Q6 and Q7 takes the minimum value. As seen from the equation (1), the transfer function $G_{ATT1}$ is minimum when the signal $e_O$ reaches the signal limiting level. In other words, the ALC circuit may be designed so that, as the input signal $e_i$ increases, the output signal $e_O$ approaches to the signal limiting level but does not exceed it.

Note here that the base-emitter characteristic of each transistor Q4 and Q5 is independent from the transfer function $G_{ATT1}$. In essential, the transfer function $G_{ATT1}$ is controlled only by the control current $I_3$. Since the rectifier $18_1$ as the current $I_3$ supply source and the shunt $20_1$ have extremely high internal impedances, the magnitude of the current $I_3$ to be supplied to the transistor Q4 is invariable when the threshold voltages of the transistors Q4 and Q5 change, in stationary condition.

Since the current $I_3$ is considerably amplified by the transistors Q4+Q5, the magnitude of the current $I_3$ is reduced to that extent. Thus, the magnitudes of the currents $I_1$ and $I_2$ can be deemed to be almost the same near the starting point of the ALC operation. Therefore, the current $I_2$ is given by the expression $I_2 \approx e_O/R2$. Namely, the output signal $e_O$ is free from the threshold voltages and h parameters of the transistors Q4 to Q8 and the forward voltage drop of the diode D1.

Figure 3:
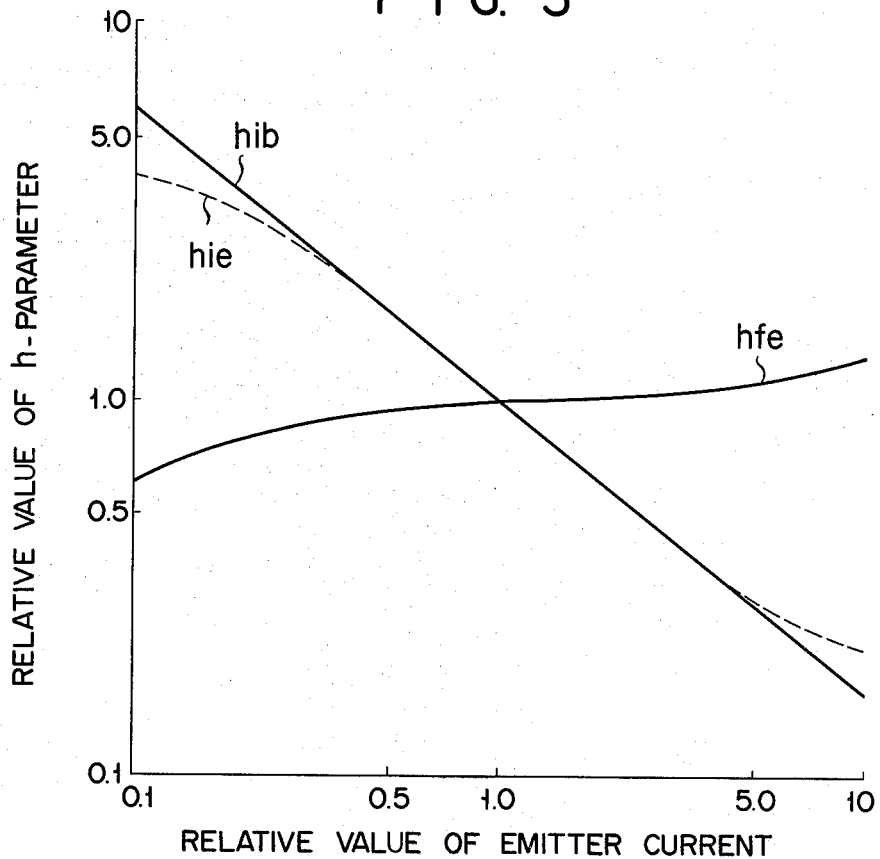
FIG. 3 shows a graph plotting h parameters of an ordinary type bipolar transistor.

FIG. 3 shows a graph illustrating h parameters of an ordinary bipolar transistor. As seen from FIG. 3, the relative changes of h parameters are smooth over a wide range of the relative change of the emitter current (or collector current) of the transistor. Here, the parameter hib is the impedance between the emitter and base for the common base connection; parameter hie the impedance between the base and emitter for the common emitter connection; parameter hfe the current amplification factor for the common emitter connection. As seen from the equation (1) and FIG. 3, setting of the operating point of the attenuator 12, i.e. the operating condition of the ALC circuit for setting a desired transfer function $G_{ATT1}$, may smoothly be made over a wide range of signal level.

Figure 4:
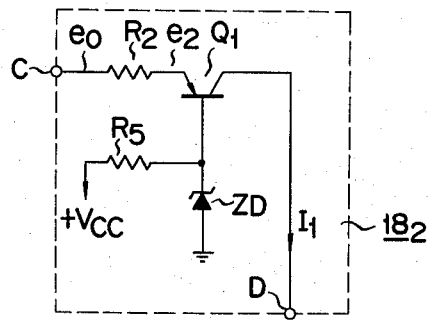
FIGS. 4, 5 and 9 show the circuit diagrams of modifications of the current rectifier shown in FIG. 2.
Figure 5:
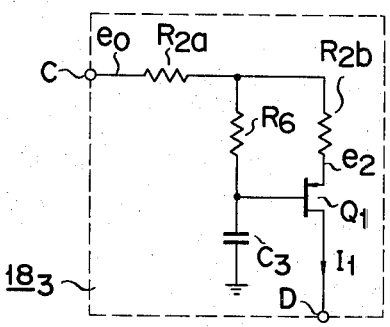

FIGS. 4 and 5 show modifications of the current rectifier 18. In the modifications, the amplifier 24 as shown in FIG. 2 is not used for means for biasing the base of the transistor Q1. The rectifier $18_2$ in FIG. 4 shows a case that the base potential of the PNP transistor Q1 is fixed. In the rectifier $18_2$, a Zener diode ZD with positive temperature coefficient is used and the power source +Vcc is connected through a resistor R5 to the connection point between the diode ZD and the transistor Q1. For the Zener diode, it is preferable to select such a type Zener diode with its positive temperature coefficient capable of neutralizing the negative one of the voltage drop across the emitter-base circuit of the transistor Q1.

The rectifier $18_3$ in FIG. 5 uses a field effect transistor of p-channel type depletion mode for self-bias connection, as the transistor Q1. The gate of the transistor Q1 is biased by the voltage drop across a resistor R2b. Assume now that the resistance of a gate resistor R6 of the transistor Q1 is much greater than that of a resistor R2a, and that the time constant by the resistor R6 and a bypass capacitor C3 is selected sufficiently large. In such a condition, the drain current of the transistor Q1, i.e. the current $I_1$, is given by $I_1 \approx (e_O - e_2)/(R2a + R2b)$ during the time that the transistor Q1 is conductive. Here assume again that the transfer conductance gm of the transistor Q1 is sufficiently large. Since the gate of the transistor Q1 is grounded via the capacitor C3 when considered as an AC circuit so that, during the conduction of the transistor Q1, the signal $e_2$ at the source of the transistor Q1 is almost zero. The potential of the signal $e_O$ lowers and the source-gate of the transistor Q1 is biased by a voltage potential larger than or equal to the pinch-off voltage, at this time, the transistor Q1 is cut off and the current $I_1$ becomes zero.

In general, the field effect transistor has a gate bias voltage providing a peculiar point at which the temperature coefficient of its drain current is zero. Accordingly, if the resistance of the resistor R2b is so selected that the temperature coefficient of the drain current $I_1$ of the transistor Q1 has zero for the value of the current $I_1$, the current $I_1$ is temperature-compensated.

Figure 7:
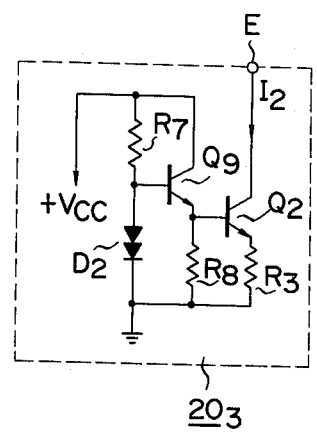
Figure 8:
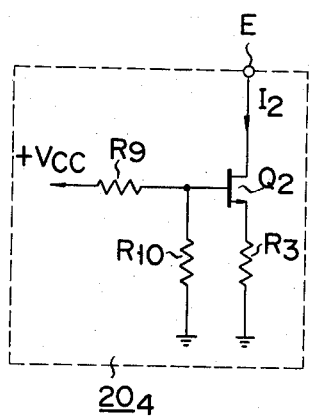

FIGS. 6 to 8 show circuit diagrams of modifications of the shunt 20. The shunt $20_2$ in FIG. 6 uses a current mirror circuit for the bias circuit of the NPN transistor Q2. If the transistors Q2 and Q3 are the same in the characteristic and the emitter resistors R3a and R3b have equal resistances, the current $I_2$ is substantially equal to the bias current fed from the constant current source 26. When the constant current source 26 feeds a constant current, the magnitude of the current $I_2$ may be varied by changing the resistance of the resistor R3a and relative to that of the resistor R3b. In the shunt $20_2$, when the constant current source 26 is temperature-compensated, the current $I_2$ also is temperature-compensated. The constant current characteristic provision of the constant current source 26 causes the current $I_2$ absorbed by the shunt $20_2$ to be independent of the voltage variation of the power source $+Vcc$.

The shunt $20_3$ in FIG. 7 makes a temperature compensation of the current $I_2$, however, the magnitude of the current $I_2$ changes in accordance with the voltage change of the power source $+Vcc$. The change of the current $I_2$ due to the negative temperature coefficients of the base-emitter voltages of the NPN transistor Q2 and a PNP transistor Q9, is nuetralized by negative temperature coefficient of a bias diode pair D2 series-connected. The anode potential of the diode D2 connected to the power source $+Vcc$ by way of a resistor R7 changes in accordance with the voltage of the power source $+Vcc$. The anode potential change of such a diode D2 is transferred to the base of the transistor Q2, through an emitter follower including the transistor Q9 and a resistor R8. Since the voltage amplitude of the emitter follower is approximately 1, it is estimated that the anode potential change appears in its original state at the base of the transistor Q2.

Generally, the internal resistance $r_i$ corresponding to the forward current change of a single diode is given $r_i \approx \Delta V_F / \Delta I_F$, where $\Delta V_F$ is a minute change of the forward voltage drop across the diode, and $\Delta I_F$ is a change of the forward current when the voltage changes $\Delta V_F$. Therefore, in FIG. 7, the voltage change of the power source $+Vcc$ is divided by the resistor R7 and the internal resistance $2r_i$ of the diode set D2, and is resulting in change of the anode potential. Accordingly, when the voltage of the power source $+Vcc$ decreases, the current $I_2$ correspondingly decreases. In case where the emitter follower comprising the transistor Q9 is omitted and a single diode is used instead of the diode pair D2 (corresponding to the example of FIG. 2), the anode potential change due to the voltage change of the power source $+Vcc$ is reduced approximately half. The diode D2 may be replaced by a thermistor with a proper negative temperature coefficient. In this case, the internal resistance of the thermistor may be larger than the internal resistance $r_i$ of the diode so that the emitter follower comprising the transistor Q9 may be omitted.

The shunt $20_3$ as shown in FIG. 7 is used for the following purposes. Assume now that the ALC circuit is used in a battery-operated tape recorder and that the signal limiting level by the ALC circuit is adjusted to have an adequate level for a new battery. In accordance with this assumption, in case that the signal limiting level is free from the voltage of the battery, it suffers from the following disadvantage. Deterioration of the battery, or decrease in the voltage of the power source $+Vcc$, causes lowering the maximum output voltage with non-distortion of the recording circuit. The result is that the ALC circuit operates to clip the recording circuit before an excessive level of a voice input signal is limited, thereby to distort the recorded voice signal.

The disadvantage is eliminated by changing the signal limiting level of the ALC circuit in accordance with the power source $+Vcc$. With the circuit in FIG. 2 so constructed that the control current $I_3$ increases with decreasing of the voltage of the power source $+Vcc$, the gain of the gain controlled circuit 16 reduces as the voltage of the power source $+Vcc$ decreases. As described, since $I_3 = I_1 - I_2$, the magnitude of the current $I_3$ may be changed by the current $I_1$ or $I_2$. In the case of the use of the shunt $20_3$, when the voltage of the power source $+Vcc$ is reduced, the current $I_3$ inversely increases and thus the signal limiting level is lowered. That is, with the reduction of the maximum output voltage with non-distortion, the upper limit of the voice signal level supplied to the recording circuit reduces. Therefore, the clipping in the recording circuit due to the reduction of the battery voltage may automatically be prevented.

The shunt $20_4$ in FIG. 8 is another example with a function similar to that of the shunt $20_3$. The operating point of an N-channel depletion mode field effect transistor Q2 is set by the resistor R3 at a peculiar position where the temperature coefficient of the drain current or the current $I_2$ becomes zero. To the gate of the transistor Q2 is applied the voltage obtained from a voltage dividing circuit including resistors R9 and R10 by which the voltage of the power source $+Vcc$ is divided. Then the voltage of the power source $+Vcc$ reduces, the gate potential of the transistor Q2 lowers and the current $I_2$ also decreases. As seen from this, the use of the shunt $20_4$ can also automatically prevent the clipping arising from the voltage reduction of the power source $+Vcc$. For the transistor Q2, an enhancement mode field effect transistor also may be used.

Figure 9:
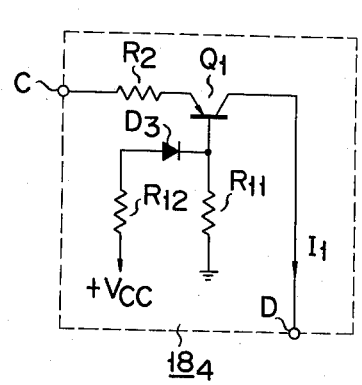

In the shunt $18_4$ in FIG. 9, the current $I_1$ produced is substantially inversely proportional to the voltage of the power source $+Vcc$. The PNP transistor Q1 is grounded at the base, via a resistor R11. The base of the transistor Q1 is connected to the cathode of a temperature compensating diode D3 of which the anode is connected to the power source $+Vcc$ via a resistor R12. The voltage change of the power source $+Vcc$ is divided by the resistors R11 and R12, and is applied to the base of the transistor Q1. When the voltage of the power source $+Vcc$ reduces, the base potential of the transistor Q1 reduces. Therefore the current $I_1$ increases. As described above, $I_3 = I_1 - I_2$ so that the current $I_3$ increases and the gain of the gain controlled circuit 16 reduces, that is to say, the signal limiting level of the ALC circuit decreases.

FIG. 10 shows another example of the circuit construction shown in FIG. 1. A major difference between the ALC circuits in FIGS. 2 and 10 is that the directions of the currents $I_1$ to $I_3$ are reverse in direction. This leads to the circuit construction of FIG. 10 somewhat different from that of FIG. 2. In the rectifier $18_5$, the transistor Q1 is of NPN type and when the potential of the signal $e_O$ is lower than the potential of the signal $e_2$, the current $I_1$ is absorbed by the transistor Q1. In the shunt $20_5$, the transistors Q2 and Q3 are of PNP type and between the base of the transistor Q2 and ground is inserted a constant current source 26. The emitter of the transistor Q3 is connected to the power source $+Vcc$ and the emitters of the transistor Q2 are connected to the power source $+Vcc$ via the resistor R3. Additionally, in the gain controlled circuit $16_2$, the transistor Q4 is of PNP type and its emitter is connected to the positive bias source Vb. The collector of it is connected to the base of the transistor Q5. The transistors Q4 and Q5 are arranged in inverted Darlington connection. The hold capacitor C2 is connected between the base and emitter of the transistor Q4. The base of the transistor Q4 is connected to the terminal F via the diode D1. The diode D1 is used to prevent an overflow current flowing into the capacitor C2, which overflow current means some of the current $I_2$ fed from the shunt $20_5$ which when $I_1 < I_2$ has failed to be absorbed as the current $I_1$ by the rectifier $18_5$.

FIGS. 11 to 16 show modifications of the gain controlled circuit 16 used in the ALC circuit as shown in FIG. 2. In the circuit $16_3$, an NPN transistor Q10 is used in place of the diode D1 for preventing inverse flow of the charges stored in the hold capacitor C2. Under the condition that the current $I_3$ flows into the terminal F when $I_1 > I_2$, it is current-amplified approximately hfe times by the transistor Q10 and then flows into the capacitor C2. On the other hand, when $I_1 < I_2$, the emitter-base path of the transistor Q10 is inversely biased to be cut off so that none of the changes stored in the capacitor C2 flows from the terminal F. When the transistor Q10 is used in place of the diode D1, the current $I_3$ to be supplied to the capacitor C2 is amplified when $I_1 > I_2$ so that the speed of the capacitor C2 to be charged up is increased. If a diode is connected in parallel between the base and emitter of the transistor Q10 (not shown), its amplification factor may freely be selected and therefore the charging speed also be freely selected. That is, the attack time in the operation of the ALC circuit may be reduced. The release time in the operation of ALC circuit has no particular difference between the cases of the diode D1 and the transistor Q10 uses.

In the gain control circuit $16_4$ in FIG. 12, the transistors Q6 and Q7 as variable impedance elements are used in the negative feedback loop of the amplifier 14. The input signal $e_i$ applied to the terminal A is led to the non-inverted input terminal of the amplifier 14, through the capacitor C1. The non-inverted input terminal is connected to the bias power source Vb through a resistor R13. The output terminal of the amplifier 14 is connected to the terminal B and, through a feedback resistor R14, to the inverted-input terminal. To the same terminal is connected the emitters of the transistors Q6 and Q7 through a DC blocking capacitor C3 and a maximum-gain setting resistor R15. The transistor Q6 is connected at the collector to the power source +Vcc and the transistor Q7 is connected at the collector to ground. To the base and collector of the transistor Q7 are connected the emitter and collector of the PNP transistor Q4, respectively. Connected between the base of the transistor Q4 and the ground circuit is a bias current source 28. The base of the transistor Q4 and the power source +Vcc have the hold capacitor C2 connected therebetween. The base of the transistor Q4 is additionally connected to the cathode of the diode D1 of which the anode is connected to the terminal F.

In the circuit $16_4$, with the notation of hib for the impedance between the base and emitter of each transistors Q6 and Q7, the impedance at the emitter connection point of the transistors Q6 and Q7 is given by $\frac{1}{2}$hib. An AC potential of the base of the transistor Q4 is at zero potential through the capacitor C2. Therefore, it may be deemed that the base of the transistor Q7 is grounded as an AC circuit. If the open loop gain of the amplifier 14 is sufficiently large, the transfer function $G_{ATT2} (=e_O/e_i)$ in the circuit $16_4$ is given $$G_{ATT2} \approx 1 + \frac{R14}{\frac{1}{2} hib + R15} \quad (2)$$

From this, it will be seen that the transfer function $G_{ATT2}$ may be controlled through change of $\frac{1}{2}$hib by the current $I_3$. Ordinarily, the hib is given by hib$\approx$26 (mV)/$I_4$ (mA).

The circuit $16_4$ operates as follows. When the signal $e_i$ is zero or extremely small, the control current $I_3$ is zero or minimum. At this time, most of bias current fed from the current source 28 flows into the base of the transistor Q4. Additionally, the emitter current (or collector current) of each transistor Q6 and Q7 taken approximately the maximum value in used in circuit design. As seen from FIG. 3, the hib of each transistor Q6 and Q7 takes the minimum value in circuit design. At this time, the transfer function $G_{ATT2}$ is maximum, as seen from the equation (2). When the level of the signal $e_O$ increases with increasing of the signal $e_i$, and the current increases. In circuit design, the current fed from the current source 28 is set constant. Therefore, as the current $I_3$ increases, the base current of the transistor Q4 relatively decreases. As a result of this, the hib of each transistor Q6 and Q7 becomes large so that the transfer function $G_{ATT2}$ becomes small. As the current $I_3$ reaches the current value fed from the current source 28, the base current of the transistor Q4 becomes almost zero and the hib of each transistor Q6 and Q7 exhibits its maximum value. At this time, the transfer function $G_{ATT2}$ has the maximum value in circuit design and the output signal $e_O$ corresponds to the signal limiting level.

The gain controlled circuit $16_5$ in FIG. 13 employs the collector resistance $r_c$ of the transistor Q5 for the variable impedance element. The characteristic curve of a bipolar transistor depicting the relationship of collector-emitter voltage to collector current with a parameter of base current, generally shows that the collector current exhibits non-saturation characteristic in a region where the collector-emitter voltage is extremely small. In the non-saturation region, the collector resistance $r_c$ changes from a relatively low value to almost infinitive value, depending on the base current. The transfer function of the circuit $16_5$ may be expressed by replacing the $\frac{1}{2}$hib in the equation (1) by $r_c$.

The gain controlled circuit $16_6$ in FIG. 14 uses the hie of each transistor Q6 and Q7 for the variable impedance element and processes a balanced input signal. As shown, the first input terminal Aa is coupled with the first phase terminal of a signal source 10; the second input terminal Ab, to the second phase terminal. The terminal Aa is connected to the non-inverted input terminal of the amplifier 14 through a series circuit including a capacitor C1a and a resistor R1a. The terminal Ab is coupled with the inverted input terminal of the amplifier 14 through a series circuit including a capacitor C1b and a resistor R1b. The nodes for the capacitor C1a and the resistor R1a and for the capacitor C1b and the resistor R1b are coupled with a bias power source Vb, through resistors R13a and R13b, respectively. As by the equation (1), the transfer function $G_{ATT3} (=e_O/e_i)$ in the circuit $16_8$ may approximately be given $$G_{ATT3} \approx \frac{2hie}{R1a + R1b + 2hie} A \quad (3)$$

When either the terminal Aa or Ab is grounded, the circuit $16_6$ can be considered as a circuit for processing an unbalanced input signal. Further, individual input signals may be applied to the terminal Aa and Ab. In this case, the circuit $16_6$ operates to mix the different signals at the terminals Aa and Ab.

The gain controlled circuit $16_7$ in FIG. 15 includes an inverted Darlington connection of transistors Q4 and Q5. In connection, the collector and emitter of the NPN transistor Q4 are connected with the base and collector of the PNP transistor Q5, respectively. The transistor Q5 is grounded at the collector and at the emitter to the emitters of transistors Q6 and Q7. The operation of the circuit 16₇ is basically analogous to that of FIG. 2 circuit 16₁.

The gain controlled circuit 16₈ in FIG. 16 has a variable impedance element of the hie of each transistor Q6 and Q7 inserted in the negative feedback loop of the amplifier 14. The output terminal and non-inverted input terminal of the amplifier 14 respectively are connected to the bases of transistors Q6 and Q7. The collectors of transistors Q6 and Q7 are commonly connected to the power source +Vcc. The bases of the transistors Q6 and Q7 are connected through a resistor R4. The base of the transistor Q7 and the ground circuit include a series circuit connected therebetween including a resistor R15 and a capacitor C4. In a similar way as in the equation (2), the transfer function $G_{ATT4}(=e_o/e_i)$ of the circuit 16₈ is given $$G_{ATT4} \approx 1 + \frac{2hie//R4}{R15} \quad (4)$$

In the circuit 16₈, increasing of the current I₃ is followed by increasing the emitter currents of the transistors Q6 and Q7. Upon the increasing, the 2hie in the equation (4) conversely reduces and thus the transfer function $G_{ATT4}$ also reduces. Although decreasing of the current I₄ is followed by increasing of the transfer function $G_{ATT4}$, provision of the resistor R4 limits the upper limit of the $G_{ATT4}$ to approximately R4/R15.

FIGS. 17 to 20 show modifications of the gain controlled circuit 16 used in the ALC circuit as shown in FIG. 10. The variable impedance element in the FIG. 17A circuit 16₉ is a combination of the h parameters hib of transistors Q6 and Q7, series-connected. In circuit connection, the base and collector of the NPN transistor Q6 respectively are coupled with the bias source Vb and the power source +Vcc. The emitter of the transistor Q6, together with the emitter of the transistor Q7, is connected to the input terminal of the amplifier 14, via a capacitor C5. The base and collector of the transistor Q7 respectively are coupled with the emitter and collector of the PNP transistor Q4. The collector of the transistor Q7 is grounded. The base of the transistor Q4 and the power source +Vcc have a hold capacitor C2 interposed therebetween. The base of transistor Q4 and the terminal F are coupled with the anode and cathode of the diode D1, respectively.

Assuming that the impedance of the capacitor C5 is sufficiently small compared to the h parameters hib of the transistors Q6 and Q7, a similar way as in equation (1) leads to the transfer function $G_{ATT5}$ ($=e_o/e_i$) given by the equation (5)

$$G_{ATT5} \approx \frac{\tfrac{1}{2} hib}{R1 + \tfrac{1}{2} hib} A = \frac{hib}{2R1 + hib} A \quad (5)$$

In the circuit 16₉, increasing the current I₃ decreases the parameter hib in the equation (5) and thus the transfer function $G_{ATT5}$ is decreased. The basic operation of the ALC circuit using the circuit 16₉ is analogous to that of the ALC using the FIG. 10 circuit 16₂.

FIG. 17B illustrates the gain controlled circuit 16₉ₐ with omission of the capacitor C5. The modification in FIG. 17B denoted by reference symbol 16₉ₐ employs a current mirror circuit including a couple of NPN transistors Q15 and Q16 to equalize the collector currents of transistors Q13 and Q14 both of NPN type. Connection of the base of the PNP transistor Q7 with the emitter of the transistor Q14. Equality of the base-emitter voltage drops of transistors Q7 and Q14, make the emitter potential of the transistor Q7 substantially equal to the base potential of the transistor Q14. In other words, since the emitter potential of the transistor Q7 and the input terminal potential of the amplifier 14 are both approximately Vb, the omission of the DC blocking capacitor C5 is allowed.

With notation of K for the ratio of the emitter areas of the transistor sets Q13 and Q14 to those of the other sets Q6 and Q7, the collector current of the transistor Q5 is multiplied K times and then multiplied one flows into the collector circuit of the transistor set Q6 and Q7. Increasing of the current I₃ in the circuit 16₉ₐ leads to the increasing of the collector current KI₄ of the transistor combination Q6 and Q7. Therefore the hib of the transistors Q6 and Q7 are decreased. As seen them the above, the circuit 16₉ₐ operates as the circuit 16₉.

Figure 18:
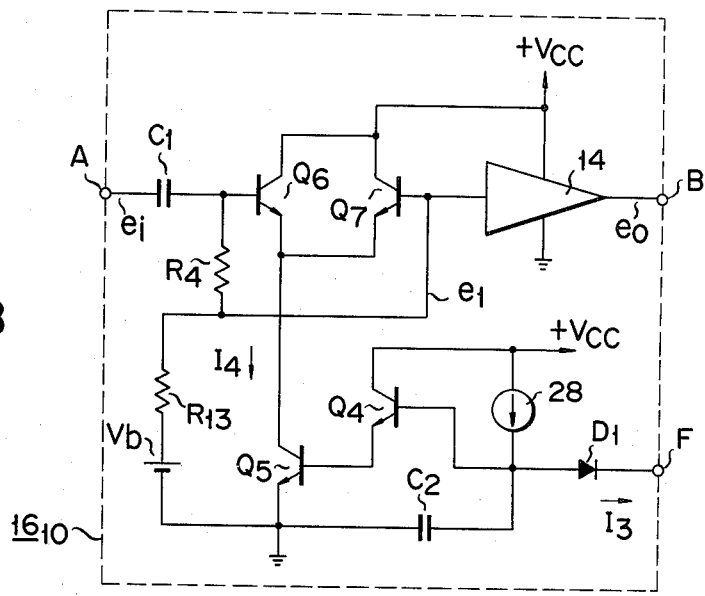

The gain controlled circuit 16₁₀ illustrated in FIG. 18 uses the h parameters hie of transistors Q6 and Q7 for the variable impedance element. As shown, the base of the NPN transistor Q6 is connected to the terminal A via a capacitor C1. The base of the NPN transistor Q7 is connected to the input terminal of the amplifier 14. The bases of the transistors Q6 and Q7 are interposed by a resistor R4. The transistors Q6 and Q7 have a common connection of the collectors to the power source +Vcc and another common connection of the emitters to the collector of the NPN transistor Q5. The emitter of the transistor Q5 is connected to ground and the base thereof, to the emitter of the NPN transistor Q4. The collector and base of the transistor Q4 are connected to the power source +Vcc and the anode of the diode D1. Connected between the base of the transistor Q4 and the power source +Vcc is the current source 28. The capacitor C2 is inserted between the base of the transistor Q4 and the ground circuit. The input terminal of the amplifier 14 is connected to the bias source Vb by way of the resistor R13.

Assuming that, in the circuit 16₁₀, the input impedance of the amplifier 14 is sufficiently large compared to the resistor R13, and R4>2hie, the thinking way similar to that in the equation (1) introduces the following approximation of the transfer function $G_{ATT6}(e_o/e_i)$ in the circuit 16₁₀ under discussion $$G_{ATT6} \approx \frac{r13}{2hie + R13} \quad (6)$$

In the circuit 16₁₀, upon increasing of the current I₃. The base current of the transistor Q4 reduces, with the result that the 2hie in the equation (6) increases and therefore the transfer function $G_{ATT6}$ reduces.

The input impedance of the amplifier 14 may be used in place of the resistor R13.

Figure 19:
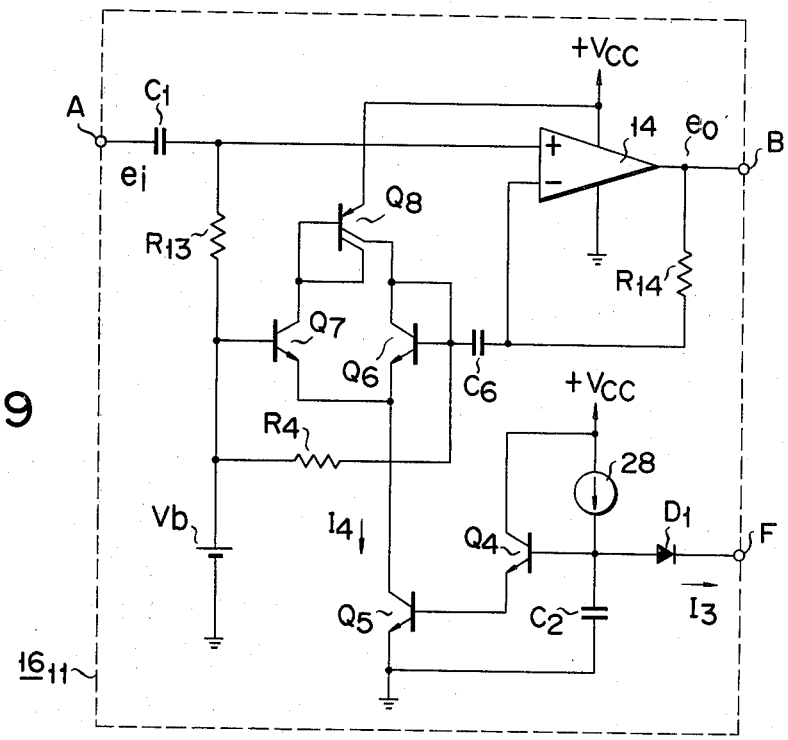

The gain controlled circuit 16₁₁ in FIG. 19 uses for the variable impedance element the h parameters hib of transistors Q6 and Q7 inserted in the negative feedback loop of the amplifier 14. The output terminal and the inverted phase input terminal of the amplifier 14 are connected through a resistor R14. The inverted phase input terminal of the amplifier 14 is connected to the base and collector of the NPN transistor Q6 through a capacitor C6. The emitter of the transistor Q6, together with the NPN transistor Q7 emitter, is connected to the collector of the NPN transistor Q5. The bases of both transistors Q6 and Q7 are interposed by a resistor R4. The base of the transistor Q7 is connected to the bias source Vb. The collectors of the transistors Q6 and Q7 are connected to the first and second collectors of a multicollector PNP transistor Q8, respectively. The base of the transistor Q8 is connected to the second collector.

Assuming that the impedance of the capacitor C6 is much smaller than 2hib, and R4>2hib, the way of the equation (2) is applied to the circuit $16_{11}$ to obtain the transfer function. The transfer function obtained is the same as the equation (2).

Figure 20:
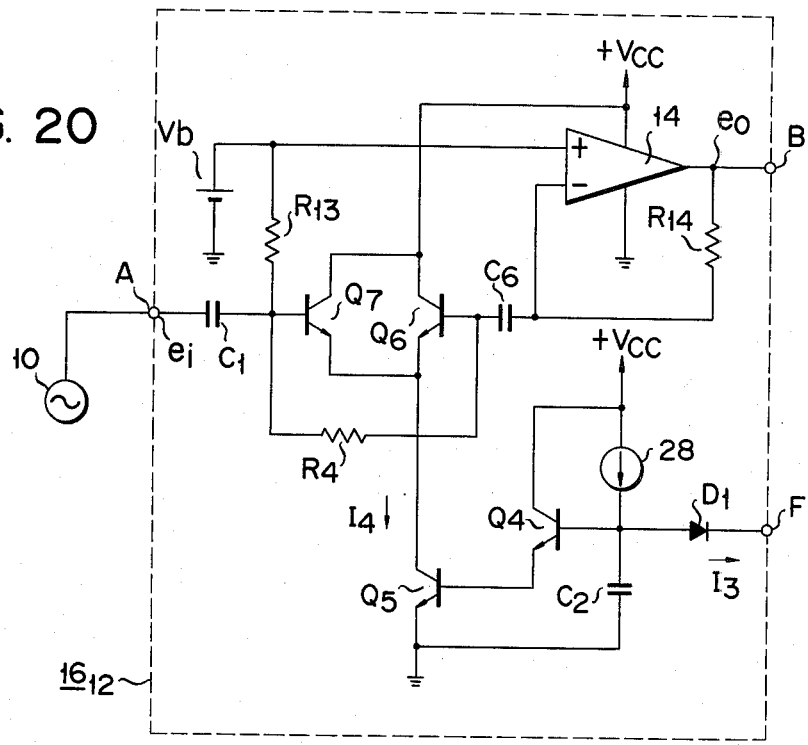
Figure 21:
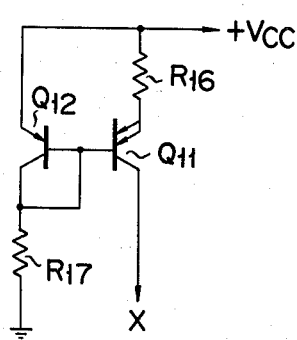
Figure 22:
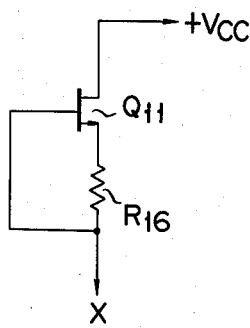
Figures 23, 24:
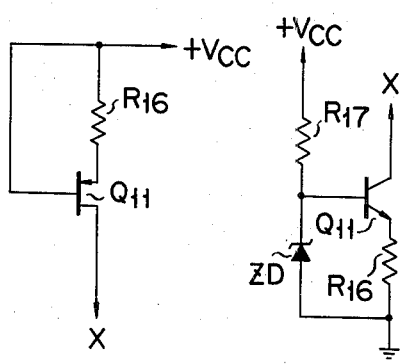

In the case of FIG. 20, the h parameters hie of the transistors Q6 and Q7 inserted in the negative feedback loop of the amplifier 14, are used for the variable impedance element of the gain controlled circuit $16_{12}$. In circuit connection, the terminal A is connected to the base of the transistor Q7 of NPN type, through the capacitor C1. The base of the transistor Q6 is connected to the inverted phase input terminal of the amplifier 14, through a capacitor C6. The collectors of transistors Q6 and Q7 are commonly connected to the power source +Vcc. The emitters thereof are connected to the collector of the transistor Q5 of NPN type. The bases of both transistors Q6 and Q7 are interposed by a resistor R4.

In the circuit $16_{12}$ in FIG. 20, assume that the internal impedance of the signal source 10 is negligible, the impedances of capacitors C1 and C6 is sufficiently small compare to the 2hie, and also R4>2hie. In accordance with this assumption, the way of the equation (2) thinking is applied to the circuit $16_{12}$ to obtain the following approximation of its transfer function $G_{ATT7}$ ($=e_O/e_i$).

$$G_{ATT7} \approx \frac{R14}{2hie} \quad (7)$$

In the circuit $16_{12}$, as the current $I_3$ increases, the base current of the transistor Q4 decreases so that the 2hie in the equation (7) increases and the transfer function $G_{ATT7}$ inversely is made small.

Circuit diagrams shown in FIGS. 21 to 24 may be used for the constant current sources 26 in FIGS. 2, 6 and 10, or the bias current sources 28 in FIGS. 12 and 18 to 20. In FIGS. 21 to 24, given bias currents flow from arrows denoted as X. The temperature coefficients of the bias currents fed from the current sources may be made zero, as described referring to FIGS. 2, 5 and 8. Further, the temperature coefficient may be selected either positive or negative.

When design is made so that the magnitudes of the bias currents supplied from the current sources 28 shown in FIGS. 12, 18 to 20 change depending on the voltage of the power source +Vcc, the function obtained is similar to that of the case using the circuits shown in FIGS. 7 to 9. Due to reduction of the power source +Vcc voltage, the bias current supplied from the current source 28 decreases, so that the base current of the transistor Q4 decreases. Whereupon, hie or hib of the transistors Q6 and Q7 increases while the transfer functions $G_{ATT2}$, $G_{ATT6}$ and $G_{ATT7}$ inversely decrease. That is to say, the signal limiting level of the ALC circuit reduces with voltage dropping of the power source +Vcc. One of the simplest mean for decreasing the bias current in accordance with the voltage dropping is to use a mere resistor in place of the current source 28 in FIG. 18, for example.

If in the circuit construction in FIG. 1, the rectifier 18 can stably supply the weak current temperature-compensated $I_1$ in the order of nA−μA, the shunt 20 may be omitted. In this case, the current $I_1$ per se is fed as the current $I_3$ to the gain controlled circuit 16. In the case of omission of the shunt 20, so long as the output signal $e_O$ is not zero, the current $I_3$ is supplied to the circuit 16. Accordingly, the ALC circuit frequently performs an automatic level-control for every level of the input signal $e_i$.

In the gain controlled circuit 16 in FIG. 2 or 10, the ALC operation is possible even if the current-direction regulating means, or the diode D1, to provide a specific direction of the current $I_3$ may be omitted.

The ALC circuit according to the invention is applicable for the AGC of a high frequency circuit, such as a radio tuner circuit.

The invention also is applicable for a gain control circuit with such a function that as the input signal increases the output signal increases, for example, a volume expander. Such a circuit may be realized in the following. For example, in FIG. 19, the current source 28 is omitted; the diode D1 is connected inversely in polarity. Such a gain controlled circuit $16_{11}$ is used in place of the circuit $16_1$ in FIG. 2 and the terminal C is connected to the terminal A and not to the terminal B.

In the gain controlled circuit 16 shown in FIGS. 2, 10, 11, 12 and 14 to 20, the transistor pair Q6 and Q7 is used for the variable impedance element. The transistor pair operates to compensate for the non-linearity of hie or hib of the transistors to each other, therefore minimizing the generation of harmonic distortion.

In all the ALC circuits shown, the DC blocking capacitors C1, C4, C5 and C6 and the bias power sources Vb may be omitted if positive and negative power sources are used for the power source of the ALC circuit.

Although specific circuit constructions have been illustrated and described herein, it is not intended that the invention be limited to the elements and circuit constructions disclosed. One skilled in the art will recognize that the particular elements or subcircuits may be used without departing from the scope and spirit of the invention.

What we claim is:

1. An automatic level control circuit for controlling the level of an input signal comprising:
   a gain controlled circuit having input, output and control ports, said input port for coupling to said input signal to be level controlled and said output port supplying a level controlled output signal, the gain of said gain controlled circuit being controllable responsive to a control current applied to said control port, said gain controlled circuit including at least one variable impedance element, the impedance of which is a function of said control current; and
   a control current source for supplying said control current, said control current being a function of the difference between a direct current component corresponding to the level of said input signal and a reference current;
   wherein the output impedance of said control current source is high so that said control current is substantially independent from the temperature change of the voltage drop occurring across said variable impedance element.

2. An automatic level control circuit for controlling the level of an input signal comprising:

a gain controlled circuit having input, output and control ports, said input port for coupling to said input signal to be level controlled and said output port supplying a level controlled output signal, the gain of said gain controlled circuit being controllable responsive to a control current applied to said control port, said gain controlled circuit including at least one variable impedance transistor, the base-emitter impedance of which is a function of said control current; and a control current source for supplying said control current, said control current being a function of the difference between a direct current component corresponding to the level of said input signal and a reference current;

wherein the output impedance of said control current source is high so that said control current is substantially independent of the temperature change of or the voltage drop across the base-emitter junction of said variable impedance transistor.

3. An automatic level control circuit for controlling the level of an input signal comprising:

a gain controlled circuit having input, output and control ports, said input port for coupling to said input signal to be level controlled and said output port supplying a level controlled output signal, the gain of said gain controlled circuit being controllable responsive to a control current applied to said control port, said gain controlled circuit including at least one variable impedance element, the impedance of which is a function of said control current; and a control current source for supplying said control current, said control current being a function of the difference between a direct current component corresponding to the level of said input signal and a reference current, said control current source comprising:

a current rectifier for providing a first current including said direct current component corresponding to the level of said input signal of said gain controlled circuit, the output of said current rectifier for coupling to said control port of said gain controlled circuit, said current rectifier comprising:

a first current source transistor having a collector wherein said first current flows:

a compensating amplifier having an inverting input terminal and an output terminal coupled to the emitter and base of said first current source transistor, respectively, in order to neutralize the temperature function of said first current; and a first resistor for setting the ratio of the magnitude of said control current to said output signal level of said gain controlled circuit, said first resistor being coupled at one end to the inverting input terminal of said compensating amplifier and being coupled at its other end to the input terminal of said gain controlled circuit; and a current shunt, also coupled to the output of said current rectifier, for absorbing a second current corresponding to a reference current having a predetermined magnitude, whereby said control current is made to be the difference between said first and second currents.

4. An automatic level control circuit for controlling the level of an input signal comprising:

a gain controlled circuit having input, output and control ports, said input port for coupling to said input signal to be level controlled and said output port supplying a level controlled output signal, the gain of said gain controlled circuit being controllable responsive to a control current applied to said control port, said gain controlled circuit including at least one variable impedance element, the impedance of which is a function of said control current; and a control current source for supplying said control current, said control current being a function of the difference between a direct current component corresponding to the level of said input signal and a reference current, said control current source comprising:

a current rectifier for absorbing a first current including said direct current component corresponding to the level of said input signal, said current rectifier comprising:

a first current source transistor having a collector wherein said first current flows:

a compensating amplifier having an inverting input terminal and an output terminal coupled to the emitter and base of said first current source transistor, respectively, in order to neutralize the temperature function of said first current; and a first resistor for setting the ratio of the magnitude of said control current to said output signal level of said gain controlled circuit, said first resistor being coupled at one end to the inverting input terminal of said compensating amplifier and being coupled at its other end to the output terminal of said gain controlled circuit; and a shunt coupled to the output of said current rectifier for conducting a second current corresponding to said reference current having a predetermined magnitude, said shunt being coupled to a circuit thorugh which said first current flows in order to produce said control current equal to the difference between said first and second currents.

5. An automatic level control circuit according to either of claims 3 or 4, further comprising current direction regulating means provided in a circuit through which said control current flows, said regulating means being conductive only when said first current exceeds said second current in order to effectively feed said control current to said variable impedance element side of said current direction regulating means only when the level of the output signal of said gain controlled circuit exceeds a predetermined threshold level.

6. An automatic level control circuit according to claim 5, wherein said current direction regulation means is a diode.

7. An automatic level control circuit according to claim 5, wherein said current direction regulating means is formed by the base-emitter path of a bipolar transistor in order to amplify said control current only when said control current is supplied to said variable impedance side of said current direction regulating means.

8. An automatic level control circuit according to either of claims 3 or 4, wherein said control current source includes control current changing means for changing said control current in accordance with the voltage dropping of a power source, in order to reduce the upper limit level of the output signal which is automatically controlled by the automatic level control circuit in accordance with the reduction of the power source voltage to be applied to a circuit connected to the automatic level control circuit.

9. An automatic level control circuit according to claim 8, wherein said control current changing means includes means for increasing the magnitude of said first current produced by said current rectifier responsive to a reduction of said power source voltage.

10. An automatic level control circuit according to claim 8, wherein said control current changing means includes means for decreasing the magnitude of said second current flowing through said shunt responsive to a reduction of said power source voltage.

11. An automatic level control circuit according to claim 8, wherein said control current changing means includes means for decreasing the magnitude of current flowing through said variable impedance element responsive to a reduction of said power source voltage.

12. An automatic level control circuit comprising:
a gain controlled circuit for automatically level-controlling an input signal to produce an output signal that is automatically level-controlled, said gain controlled circuit including a variable impedance element having an impedance controllable by a control current; and
a control current source for supplying said control current equal to the difference between a direct current component corresponding to the input signal level of said gain controlled circuit and a reference current, said control current source comprising:
a current rectifier for providing a first current including a direct current component corresponding to the level of said input signal of said gain controlled circuit, said current rectifier comprising:
a first current source transistor having a collector in which said first current flows;
a compensating amplifier having an inverting input terminal and the output terminal coupled to the emitter and base of said first current source transistor, respectively, in order to neutralize the temperature change of said first current; and
a first resistor for setting the ratio of the magnitude of said control current to the output signal level of said gain controlled circuit, said first resistor being coupled at one end to the inverting input terminal of said compensating amplifier and being coupled at its other end with the output signal from said gain controlled circuit; and
a current shunt for absorbing a second current corresponding to said reference current magnitude, said current shunt being coupled to a circuit through which said first current flows in order to produce said control current equal to the difference between said first and second currents; and
means for compensating the temperature coefficient of said control current so that the temperature coefficient of said control current source is substantially zero.

13. An automatic level control circuit comprising:
a gain controlled circuit for automatically level-controlling an input signal to produce an output signal that is automatically level-controlled, said gain controlled circuit including a variable impedance element having an impedance controllable by a control current;
control current source for supplying said control current equal to the difference between a direct current component corresponding to the input signal level of said gain controlled circuit and a reference current, said control current source comprising:
current rectifier means for absorbing a first current including a direct current component corresponding to the level of said input signal of said gain controlled circuit, said current rectifier comprising:
a current source transistor having a collector in which said first current flows;
a compensating amplifier having an inverting input terminal and the output terminal coupled to the emitter and base of said first current source transistor, respectively, in order to neutralize the temperature change of said first current; and
a first resistor for setting the ratio of the magnitude of said control current to the output signal level of said gain controlled circuit, said first resistor being coupled at one end to the inverting input terminal of said compensating amplifier and being coupled at its other end with the output signal from said gain controlled circuit; and
a shunt for feeding a second current corresponding to said reference current having a predetermined magnitude, said shunt being coupled to a circuit through which said first current flows in order to supply said controll current equal to the difference between said first and second currents; and
means for compensating the temperature coefficient of said control current so that the temperature coefficient of said control current source is substantially zero.

14. An automatic level control circuit according to either of claims 12 or 13, wherein the gain of said gain controlled circuit is inversely proportional to the level of said input signal.

15. An automatic level control circuit according to either of claims 12 or 13, wherein the gain of said gain controlled circuit is proportional to the level of said input signal.

16. An automatic level control circuit according to either of claims 12 or 13, wherein said means for compensating the temperature coefficient includes:
first means for compensating the temperature coefficient of said first current; and
second means for compensating the temperature coefficient of said second current.

17. An automatic level control circuit according to either of claims 12 or 13, further comprising current direction regulating means provided in a circuit through which said control current flows, said regulating means being conductive only when said first current exceeds said second current in order to effectively feed said control current to said variable impedance element side of said current direction regulating means only when the level of the output signal of said gain controlled circuit exceeds a given value.

18. An automatic level control circuit according to claim 17, wherein said current direction regulating means is diode.

19. An automatic level control circuit according to claim 17, wherein said current direction regulating means in formed by the base-emitter path of a bipolar transistor in order to amplify said control current only when said control current is supplied to said variable impedance side of said current direction regulating means.

20. An automatic level control circuit according to either of claims 60 or 61, wherein said control current source includes control current changing means for changing said control current in accordance with the voltage dropping of a power source, in order to reduce the upper limit level of said output signal which is automatically controlled by the automatic level control circuit in accordance with the reduction of the power source voltage to be applied to circuit coupled to said automatic level control circuit.

21. An automatic level control circuit according to claim 20, wherein said control current changing means includes means for increasing the magnitude said first current produced by said current rectifier responsive to a reduction of said power source voltage.

22. An automatic level control circuit according to claim 20, wherein said control current changing means includes means for decreasing the magnitude of said second current produced by said shunt responsive to a reduction of said power source voltage.

23. An automatic level control circuit according to claim 20, wherein said control current changing means includes means for decreasing the current flowing through said variable impedance element responsive to reduction of said power source voltage.

24. An automatic level control circuit according to either of claims 12 or 13, wherein said gain controlled circuit comprises:
 a current controlled attenuator including said variable impedance element and a fixed impedance element in series circuit in order that the attenuation ratio is changed responsive to said control current; and
 an amplifier for amplifying a signal attenuated by said current controlled attenuator to produce the automatically level controlled output signal.

25. An automatic level control circuit according to either of claims 12 or 13, wherein said gain controlled circuit comprises a gain controlled amplifier having a negative feedback loop including said variable impedance element for producing an output signal automatically level-controlled in response to said input signal.

* * * * *